US006894583B2

(12) United States Patent
Brown et al.

(10) Patent No.: US 6,894,583 B2
(45) Date of Patent: May 17, 2005

(54) VARIABLE QUARTER-WAVE TRANSFORMER

(75) Inventors: Stephen B. Brown, Palm Bay, FL (US); James J. Rawnick, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 147 days.

(21) Appl. No.: 10/300,455

(22) Filed: Nov. 19, 2002

(65) Prior Publication Data

US 2004/0095202 A1 May 20, 2004

(51) Int. Cl.[7] .................................................. H03H 7/38

(52) U.S. Cl. .......................................... 333/35; 333/263

(58) Field of Search ................................ 333/156, 159, 333/161, 33, 35, 263

(56) References Cited

U.S. PATENT DOCUMENTS

| | | | | |
|---|---|---|---|---|
| 5,162,972 A | | 11/1992 | Gripshover et al. | 361/277 |
| 5,679,624 A | * | 10/1997 | Das | 505/210 |
| 6,515,235 B2 | | 2/2003 | Moller | 174/256 |

OTHER PUBLICATIONS

U.S. Appl. No. 10/369,436, Rawnick et al., filed Feb. 18, 2003.
U.S. Appl. No. 10/387,208, Rawnick et al., filed Mar. 11, 2003.
U.S. Appl. No. 10/330,755, Rawnick et al., filed Dec. 27, 2002.
U.S. Appl. No. 10/330754, Rawnick et al., filed Dec. 27, 2002.
U.S. Appl. No. 10/300,456, Rawnick et al., filed Nov. 19, 2002.
U.S. Appl. No. 10/361,548, Rawnick et al., filed Feb. 10, 2003.
U.S. Appl. No. 10/387,209, Rawnick et al., filed Mar. 11, 2003.
U.S. Appl. No. 10/387,194, Brown et al., filed Mar. 11, 2003.
U.S. Appl. No. 10/438,435, Brown et al., filed May 15, 2003.
U.S. Appl. No. 10/414,696, Brown et al., filed Apr. 16, 2003.
U.S. Appl. No. 10/637,027, Brown et al., filed Aug. 7, 2003.
U.S. Appl. No. 10/414,650, Brown et al., filed Apr. 16, 2003.
U.S. Appl. No. 10/635,629, Brown et al., filed Aug. 6, 2003.
U.S. Appl. No. 10/459,067, Brown et al., filed Jun. 11, 2003.
U.S. Appl. No. 10/438,436, Rawnick et al., filed May 15, 2003.
U.S. Appl. No. 10/626,090 Brown et al., filed Jul. 24, 2003.
U.S. Appl. No. 10/635,582, Rawnick et al., filed Aug. 6, 2003.
U.S. Appl. No. 10/632,632, Rawnick et al., filed Aug. 1, 2003.

(Continued)

*Primary Examiner*—Stephen E. Jones
(74) *Attorney, Agent, or Firm*—Sacco & Associates, PA

(57) ABSTRACT

A continuously variable quarter-wave transformer (103) including a quarter-wave element (110). The quarter-wave transformer has a characteristic impedance and is at least partially coupled to a fluidic dielectric (108). A controller (136) is provided for controlling a composition processor (101) which is adapted for dynamically changing a composition of the fluidic dielectric (108) to vary the permittivity and permeability in response to a control signal (137). The permeability and permittivity can be varied together to maintain approximately constant impedance and length in wavelengths at different operating frequencies, or to vary impedance and maintain constant length at a given frequency. The quarter-wave transformer (103) can be coupled to a solid dielectric substrate material. A plurality of component parts can be dynamically mixed together in the composition processor (101) responsive to the control signal (137).

35 Claims, 3 Drawing Sheets

OTHER PUBLICATIONS

U.S. Appl. No. 10/614,149, Brown et al., filed Jul. 7, 2003.
U.S. Appl. No. 10/634,219, Rawnick et al., filed Aug. 5, 2003.
U.S. Appl. No. 10/458,859, Rawnick et al., filed Jun. 11, 2003.
U.S. Appl. No. 10/624,378, Brown et al., filed Jul. 22, 2003.
U.S. Appl. No. 10/438,433, Rawnick et al., filed May 15, 2003.
U.S. Appl. No. 10/460,947, Rawnick et al., filed Jun. 13, 2003.
U.S. Appl. No. 10/421,352, Rawnick et al., filed Apr. 23, 2003.
U.S. Appl. No. 10/409,261, Pike, filed Apr. 8, 2003.
U.S. Appl. No. 10/441,743, Pike, filed May 19, 2003.
U.S. Appl. No. 10/628,846, Pike et al., filed Jul. 28, 2003.

* cited by examiner

VARIABLE QUARTER-WAVE TRANSFORMER

BACKGROUND OF THE INVENTION

1. Statement of the Technical Field

The inventive arrangements relate generally to methods and apparatus for providing increased design flexibility for RF circuits, and more particularly to variable quarter-wave transformers.

2. Description of the Related Art

A quarter-wave transformer is a specialized transmission line that typically is used in radio frequency (RF) circuits to impedance match various circuit components. Notably, quarter-wave transformers can be incorporated into many types of RF circuit components. For example, quarter-wave transformers can be included as elements in multi-section transformers, directional couplers, power splitters, filters, resonant lines, etc. Quarter-wave transformers are commonly implemented on specially designed printed circuit boards or substrates and comprise a quarter-wave element, which is a transmission line section, one or more input ports, and one or more output ports.

As the name implies, the electrical length of the quarter-wave element is usually one-quarter of a wavelength of a selected frequency, but a quarter-wave transformer also can be any odd multiple (2n+1) of the one-quarter wavelength. Further, the proper characteristic impedance of a quarter-wave transformer is given by the formula $Z_0=\sqrt{Z_1Z_2}$, where $Z_0$ is the desired characteristic impedance of the quarter-wave transformer, $Z_1$ is the impedance of a first transmission line to be matched, and $Z_2$ is the impedance of a second transmission line or load being matched to the first transmission line. When more than one transmission line is connected to the input port or output port of the quarter-wave transformer, for example as in a power divider, $Z_1$ and $Z_2$ are net impedance values.

Quarter-wave transformers can be formed in many different ways. One configuration, known as microstrip, places the quarter-wave transformer on a board surface and provides a second conductive layer, commonly referred to as a ground plane. A second type of configuration known as buried microstrip is similar except that the quarter-wave transformer is covered with a dielectric substrate material. In a third configuration, known as stripline, the quarter-wave transformer is sandwiched within substrate between two electrically conductive (ground) planes.

Two critical factors affecting the performance of a substrate material are permittivity (sometimes called the relative permittivity or $\epsilon_r$) and permeability (sometimes referred to as relative permeability or $\mu_r$). The relative permittivity and permeability determine the propagation velocity of a signal, which is approximately inversely proportional to $\sqrt{\mu\epsilon}$, and therefore effect the electrical length of a quarter-wave transformer. Further, ignoring loss, the characteristic impedance of a quarter-wave transformer, such as stripline or microstrip, is equal to $\sqrt{L_1/C_1}$ where $L_l$ is the inductance per unit length and $C_l$ is the capacitance per unit length. The values of $L_l$ and $C_l$ are generally determined by the permittivity and the permeability of the dielectric material(s) used to separate the transmission line structures as well as the physical geometry and spacing of the line structures.

In a conventional RF design, a substrate material is selected that has a relative permittivity value suitable for the design. Notably, conventional substrate materials typically have a relative permeability of approximately 1.0. Once the substrate material is selected, the quarter-wave transformer characteristic impedance and frequency optimization is exclusively adjusted by controlling the line geometry and physical structure. One problem encountered when designing such quarter-wave transformers is that quarter-wave transformers are generally optimized only for use at a single frequency and odd harmonics of that frequency. Hence, a circuit that includes a quarter-wave transformer typically does not perform well over a range of frequencies that are not harmonically related. Modern RF circuits, however, commonly process multiple signals operating on different frequencies. Accordingly, the use of conventional dielectric substrate arrangements have proven to be a limitation in designing quarter-wave transformers for modern RF circuits.

SUMMARY OF THE INVENTION

The present invention relates to a continuously variable quarter-wave transformer, which includes a quarter-wave element. The quarter-wave transformer has characteristic impedance and is at least partially coupled to a fluidic dielectric having a permittivity and a permeability. A controller is provided for controlling a composition processor which is adapted for dynamically changing a composition of the fluidic dielectric to vary the permittivity and/or permeability in response to a control signal. The permeability can be varied to maintain the characteristic impedance approximately constant when the permittivity is varied or to adjust the characteristic impedance when the permittivity is maintained approximately constant. Likewise, the permittivity can be varied to maintain the characteristic impedance approximately constant when the permeability is varied or to adjust the characteristic impedance when the permeability is maintained approximately constant.

The quarter-wave transformer also can be coupled to a solid dielectric substrate material, for example a substrate formed from a ceramic material, such as low temperature co-fired ceramic material. The permeability can be varied to be approximately equal to $\mu_{r,sub}(\epsilon_r/\epsilon_{r,sub})$ where $\mu_{r,sub}$ is the permeability of the solid dielectric substrate, $\epsilon_r$ is the permittivity of the fluidic dielectric and $\epsilon_{r,sub}$ is the permittivity of the solid dielectric substrate.

A plurality of component parts can be dynamically mixed together in the composition processor responsive to the control signal to form the fluidic dielectric. The component parts can consist of a low permittivity, low permeability component, a high permittivity, low permeability component, and a high permittivity, high permeability component. The composition processor can include at least one proportional valve, at least one mixing pump, and at least one conduit for selectively mixing and communicating a plurality of the components of the fluidic dielectric from respective fluid reservoirs to a cavity coupled to the quarter-wave transformer. The composition processor also can include a component part separator adapted for separating the component parts of the fluidic dielectric for subsequent reuse. In one arrangement, the fluidic dielectric can be comprised of an industrial solvent that has a suspension of magnetic particles contained therein consisting of ferrite, metallic salts, or organo-metallic particles, containing between about 50% to 90% magnetic particles by weight.

DETAILED DESCRIPTION OF THE PREFERRED EMBODIMENTS

The present invention provides the circuit designer with an added level of flexibility by permitting a fluidic dielectric to be used in an RF circuit, thereby enabling the dielectric properties proximate to a quarter-wave transformer to be varied. The ability to vary the dielectric properties enables the quarter-wave transformer to be used to match impedances over a broad frequency range, thereby minimizing RF signal reflections and maximizing power transfer. Since propagation velocity is inversely proportional to $\sqrt{\mu\epsilon}$, increasing the permittivity ($\epsilon$) and/or permeability ($\mu$) of the fluidic dielectric decreases propagation velocity of a signal on the quarter-wave transformer, and thus the signal wavelength. Likewise, decreasing the permittivity and/or permeability increases the propagation velocity and wavelength of a signal. Accordingly, a quarter-wave transformer of a given size which has variable dielectric properties can be used over a broad range of frequencies. Further, the permittivity and/or permeability can be chosen to result in a desired characteristic impedance ($Z_0$) for the quarter-wave transformer as well, thereby enabling the quarter-wave transformer to be used with a variety of circuit components having different impedance values. Notably, the characteristic impedance can be held constant while the propagation velocity of a signal is adjusted and the propagation velocity can be held constant while the characteristic impedance is adjusted. Further, the characteristic impedance and the propagation velocity can be simultaneously adjusted.

Figure 1:
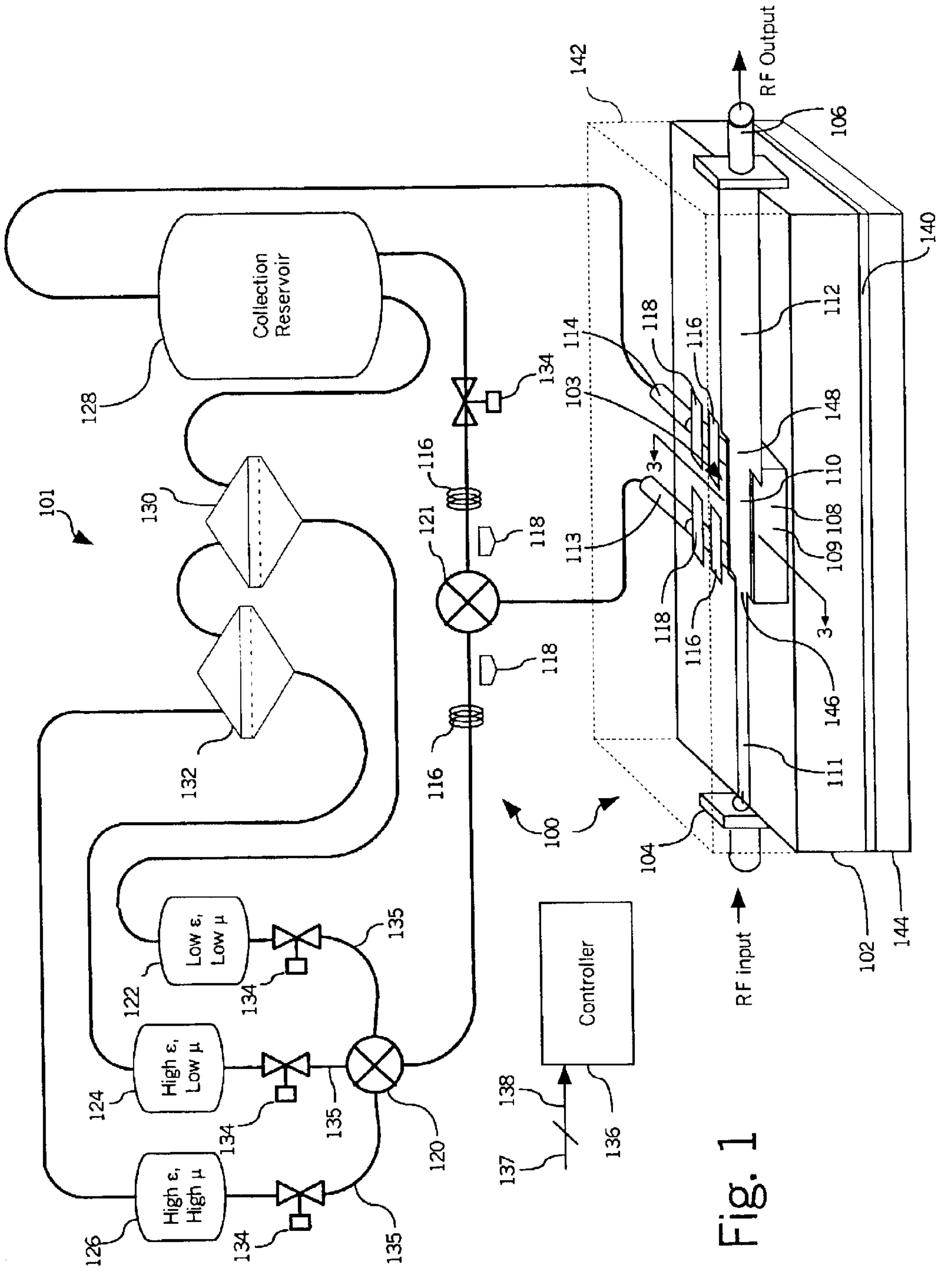
FIG. 1 is a block diagram useful for understanding the variable quarter-wave transformer of the invention.

FIG. 1 is a conceptual diagram that is useful for understanding the continuously variable quarter-wave transformer of the present invention. The quarter-wave transformer apparatus 100 includes a quarter-wave transformer 103 comprising a quarter-wave element 110, which has predetermined length. The quarter-wave transformer 103 also includes a first port 146 and a second port 148. Further, the quarter-wave transformer 103 is at least partially coupled to a fluidic dielectric 108, has an associated characteristic impedance, and is suspended over a ground plane 140, but again, the invention is not so limited. A first transmission line 111 is connected to the first port 146 and a second transmission line 112, or load, is connected to the second port. It should be noted that multiple transmission lines also can be connected to the first port 146 or the second port 148. When more than one transmission line is connected to the input port 146 or output port 148, $Z_1$ and $Z_2$ are net impedance values.

The fluidic dielectric 108 is constrained within a cavity region 109 that is generally positioned relative to the quarter-wave element 110 so as to be electrically and magnetically coupled thereto. A composition processor 101 is provided for changing a composition of the fluidic dielectric 108 to vary its permittivity and/or permeability. A controller 136 controls the composition processor for selectively varying the permittivity and/or permeability of the fluidic dielectric 108 in response to a control signal 137. By selectively varying the composition of the fluidic dielectric, the controller 136 can control propagation velocity of an RF signal along the quarter-wave element 110. This characteristic can be used to selectively tune the quarter-wave transformer 103 to optimize the quarter-wave transformer 103 for a predetermined operational frequency as established by the control signal 137.

The permittivity and/or permeability of the fluidic dielectric 108 also can be adjusted to change the characteristic impedance of the quarter-wave transformer 103. Tuning of the characteristic impedance can be beneficial if there is a change in an impedance of any circuit element connected to the quarter-wave transformer. According to a preferred embodiment, the composition processor is also adapted for separating the component parts of the fluidic dielectric so that they can be subsequently re-used.

Composition of Fluidic Dielectric

The fluidic dielectric can be comprised of several component parts that can be mixed together to produce a desired permeability and permittivity required for a particular time delay and transmission line characteristic impedance. In this regard, it will be readily appreciated that fluid miscibility and particle suspension are key considerations to ensure proper mixing. Another key consideration is the relative ease by which the component parts can be subsequently separated from one another. The ability to separate the component parts is important when the time delay requirements change. Specifically, this feature ensures that the component parts can be subsequently re-mixed in a different proportion to form a new fluidic dielectric.

The resultant mixture comprising the fluidic dielectric also preferably has a relatively low loss tangent to minimize the amount of RF energy lost in the quarter-wave transformer. However, devices with higher insertion loss may be acceptable in some instances so this may not be a critical factor. Many applications also require quarter-wave transformers with a broadband response. Accordingly, it may be desirable in many instances to select component mixtures that produce a fluidic dielectric that has a relatively constant response over a broad range of frequencies.

Aside from the foregoing constraints, there are relatively few limits on the range of component parts that can be used to form the fluidic dielectric. Accordingly, those skilled in the art will recognize that the examples of component parts, mixing methods and separation methods as shall be disclosed herein are merely by way of example and are not intended to limit in any way the scope of the invention. Also, the component materials are described herein as being mixed in order to produce the fluidic dielectric. However, it should be noted that the invention is not so limited. Instead, it should be recognized that the composition of the fluidic dielectric could be modified in other ways. For example, the component parts could be selected to chemically react with one another in such a way as to produce the fluidic dielectric with the desired values of permittivity and or permeability. All such techniques will be understood to be included to the extent that it is stated that the composition of the fluidic dielectric is changed.

A nominal value of permittivity ($\epsilon_r$) for fluids is approximately 2.0. However, the component parts for the fluidic dielectric can include fluids with extreme values of permittivity. Consequently, a mixture of such component parts can be used to produce a wide range of intermediate permittivity values. For example, component fluids could be selected with permittivity values of approximately 2.0 and about 58 to produce a fluidic dielectric with a permittivity anywhere within that range after mixing. Dielectric particle suspensions can also be used to increase permittivity.

According to a preferred embodiment, the component parts of the fluidic dielectric can be selected to include a low permittivity, low permeability component and a high permittivity, high permeability component. These two components can be mixed as needed for increasing permittivity while maintaining a relatively constant ratio of permittivity to permeability. A third component part of the fluidic dielectric can include a high permittivity, low permeability component for allowing adjustment of the permittivity of the fluidic dielectric independent of the permeability.

High levels of magnetic permeability are commonly observed in magnetic metals such as Fe and Co. For example, solid alloys of these materials can exhibit levels of $\mu_r$ in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particle sizes in the range of 1 nm to 20 $\mu$m are common. The composition of particles can be varied as necessary to achieve the required range of permeability in the final mixed fluidic dielectric after mixing. However, magnetic fluid compositions are typically between about 50% to 90% particles by weight. Increasing the number of particles will generally increase the permeability.

An example of a set of component parts that could be used to produce a fluidic dielectric as described herein would include oil (low permittivity, low permeability), a solvent (high permittivity, low permeability) and a magnetic fluid, such as combination of an oil and a ferrite (low permittivity and high permeability). A hydrocarbon dielectric oil such as Vacuum Pump Oil MSDS-12602 could be used to realize a low permittivity, low permeability, and low electrical loss fluid. A low permittivity, high permeability fluid may be realized by mixing the hydrocarbon fluid with magnetic particles or metal powders which are designed for use in ferrofluids and magnetoresrictive (MR) fluids. For example magnetite magnetic particles can be used. Magnetite is commercially available from FerroTec Corporation of Nashua, N.H. 03060. An exemplary metal powder that can be used is iron-nickel, which can be provided by Lord Corporation of Cary, N.C. Fluids containing electrically conductive magnetic particles require a mix ratio low enough to ensure that no electrical path can be created in the mixture. Additional ingredients such as surfactants can be included to promote uniform dispersion of the particles. High permittivity can be achieved by incorporating solvents such as formamide, which inherently posses a relatively high permittivity. Fluid Permittivity also can be increased by adding high permittivity powders such as Barium Titanate manufactured by Ferro Corporation of Cleveland, Ohio 44114-7000. For broadband applications, the fluids would not have significant resonances over the frequency band of interest.

Processing of Fluidic Dielectric for Mixing/Unmixing of Components

The composition processor 101 can be comprised of a plurality of fluid reservoirs containing component parts of fluidic dielectric 108. These can include a first fluid reservoir 122 for a low permittivity, low permeability component of the fluidic dielectric, a second fluid reservoir 124 for a high permittivity, low permeability component of the fluidic dielectric, and a third fluid reservoir 126 for a high permittivity, high permeability component of the fluidic dielectric. Those skilled in the art will appreciate that other combinations of component parts may also be suitable and the invention is not intended to be limited to the specific combination of component parts described herein.

A cooperating set of proportional valves 134, mixing pumps 120, 121, and connecting conduits 135 can be provided as shown in FIG. 1 for selectively mixing and communicating the components of the fluidic dielectric 108 from the fluid reservoirs 122, 124, 126 to cavity 109. The composition processor also serves to separate out the component parts of fluidic dielectric 108 so that they can be subsequently re-used to form the fluidic dielectric with different permittivity and/or permeability values. All of the various operating functions of the composition processor can be controlled by controller 136. The operation of the composition processor shall now be described in greater detail with reference to FIG. 1 and the flowchart shown in FIG. 2.

Figure 2:
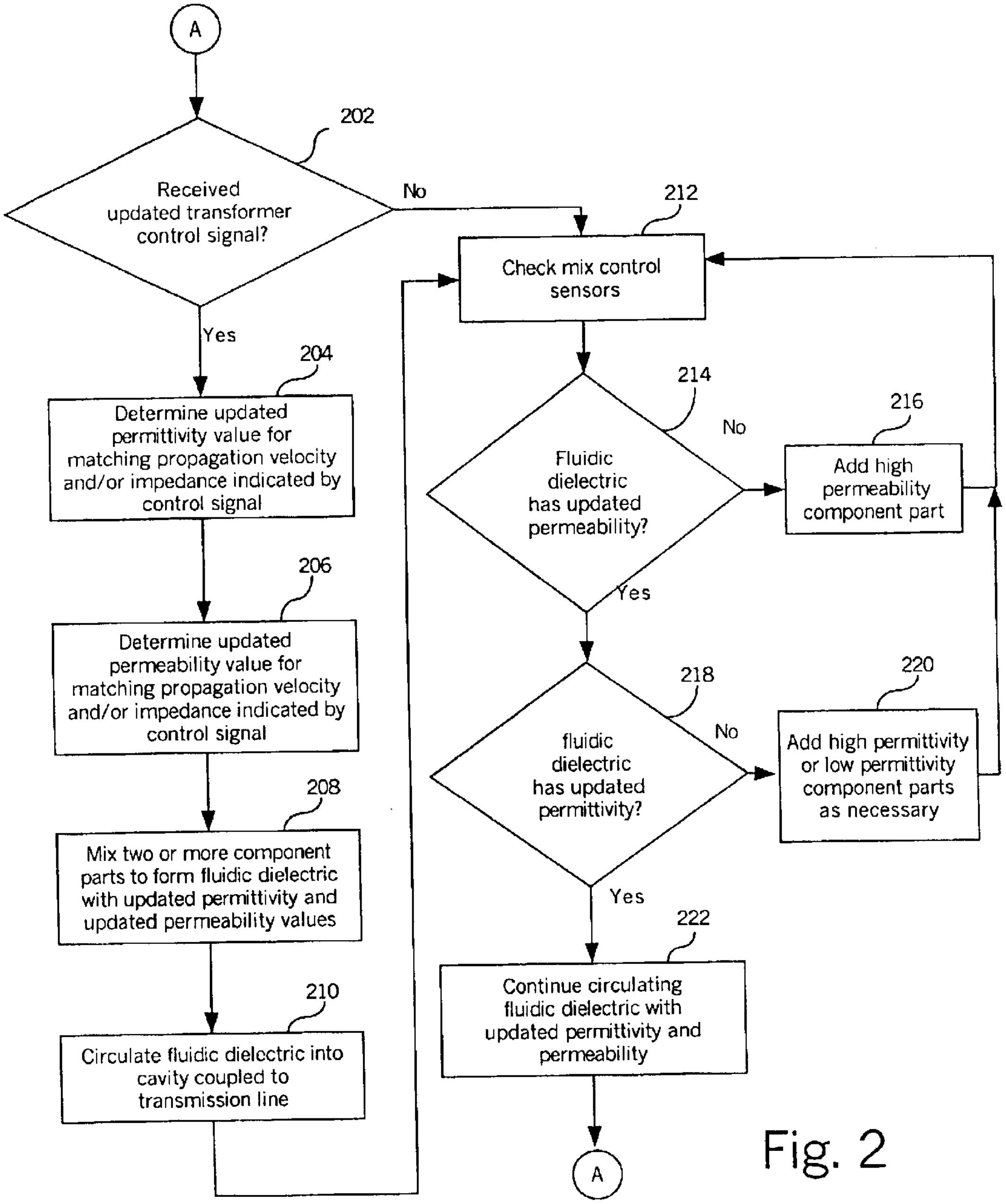
FIG. 2 is a flow chart that is useful for understanding the process of the invention.

The process can begin in step 202 of FIG. 2, with controller 136 checking to see if an updated control signal 137 has been received on a control signal input line 138. If so, then the controller 136 continues on to step 204 to determine an updated permittivity value for producing the characteristic impedance and/or signal propagation velocity indicated by the control signal 137. The updated permittivity value necessary for achieving the indicated characteristic impedance and/or signal propagation velocity can be determined using a look-up table. Alternatively, the updated permittivity value can be calculated directly based on the length of the quarter-wave element 110 using equations well known to those skilled in the art.

In step 206, the controller can determine an updated permeability value required for producing the characteristic impedance and/or signal propagation indicated by the control signal 137. Notably, the updated permeability value should be calculated using the updated permittivity value since the propagation velocity is approximately inversely proportional to $\sqrt{\mu\epsilon}$ and the characteristic impedance is equal to $\sqrt{L_l/C_l}$, wherein $L_l$ and $C_l$ are functions of permeability and permittivity, respectively. In another arrangement, steps 204 and 206 can be reversed wherein the updated permeability value is determined first and the updated permittivity value is determined second.

In step 208, the controller 136 causes the composition processor 101 to begin mixing two or more component parts in a proportion to form fluidic dielectric that has the updated permittivity and permeability values determined earlier. This mixing process can be accomplished by any suitable means. For example, in FIG. 1 a set of proportional valves 134 and mixing pump 120 are used to mix component parts from reservoirs 122, 124, 126 appropriate to achieve the desired updated permeability and permittivity.

In step 210, the controller causes the newly mixed fluidic dielectric 108 to be circulated into the cavity 109 through a second mixing pump 121. In step 212, the controller checks one or more sensors 116, 118 to determine if the fluidic dielectric being circulated through the cavity 109 has the proper values of permeability and permittivity. Sensors 116 are preferably inductive type sensors capable of measuring permeability. Sensors 118 are preferably capacitive type sensors capable of measuring permittivity. The sensors can be located as shown, at the input to mixing pump 121. Sensors 116, 118 are also preferably positioned within solid dielectric substrate 102 to measure the permeability and permittivity of the fluidic dielectric passing through input conduit 113 and output conduit 114. Note that it is desirable to have a second set of sensors 116, 118 at or near the cavity 109 so that the controller can determine when the fluidic dielectric with updated permittivity and permeability values has completely replaced any previously used fluidic dielectric that may have been present in the cavity 109.

In step 214, the controller 136 compares the measured permeability to the desired updated permeability value determined in step 206. If the fluidic dielectric does not have the proper updated permeability value, the controller 136 can cause additional amounts of high permeability component part to be added to the mix from reservoir 126, as shown in step 216.

If the fluidic dielectric is determined to have the proper level of permeability in step 214, then the process continues on to step 218 where the measured permittivity value from step 212 is compared to the desired updated permittivity value from step 204. If the updated permittivity value has not been achieved, then high or low permittivity component parts are added as necessary in step 220. If both the permittivity and permeability passing into and out of the cavity 109 are the proper value, the system can stop circulating the fluidic dielectric and the system returns to step 202 to wait for the next updated control signal.

Significantly, when updated fluidic dielectric is required, any existing fluidic dielectric must be circulated out of the cavity 109. Any existing fluidic dielectric not having the proper permeability and/or permittivity can be deposited in a collection reservoir 128. The fluidic dielectric deposited in the collection reservoir can thereafter be re-used directly as a fourth fluid by mixing with the first, second, and third fluids or separated out into its component parts in separator units 130, 132 so that it may be re-used at a later time to produce additional fluidic dielectric. The aforementioned approach includes a method for sensing the properties of the collected fluid mixture to allow the fluid processor to appropriately mix the desired composition, and thereby, allowing a reduced volume of separation processing to be required. For example the component parts can be selected to include a first fluid made of a high permittivity solvent completely miscible with a second fluid made of a low permittivity oil that has a significantly different boiling point. A third fluid component can be comprised a ferrite particle suspension in a low permittivity oil identical to the first fluid such that the first and second fluids do not form azeotropes. Given the foregoing, the following process may be used to separate the component parts.

A first stage separation process in separator unit 130 would utilize distillation to selectively remove the first fluid from the mixture by the controlled application of heat thereby evaporating the first fluid, transporting the gas phase to a physically separate condensing surface whose temperature is maintained below the boiling point of the first fluid, and collecting the liquid condensate for transfer to the first fluid reservoir 122. A second stage process in separator 132 would introduce the mixture, free of the first fluid, into a chamber that includes an electromagnet that can be selectively energized to attract and hold the paramagnetic particles while allowing the pure second fluid to pass which is then diverted to the second fluid reservoir 124. Upon de-energizing the electromagnet, the third fluid would be recovered by allowing the previously trapped magnetic particles to combine with the fluid exiting the first stage which is then diverted to the third fluid reservoir 126.

Those skilled in the art will recognize that the specific process used to separate the component parts from one another will depend largely upon the properties of materials that are selected and the invention. Accordingly, the invention is not intended to be limited to the particular process outlined above.

RF Unit Structure, Materials and Fabrication

In theory, constant characteristic impedance can be obtained for the quarter-wave element 110 by maintaining a constant ratio of permittivity to permeability in the dielectric to which the line is coupled. Accordingly, in those instances where the quarter-wave transformer is for all practical purposes coupled exclusively to the fluidic dielectric, then it is merely necessary to maintain a constant ratio of $\epsilon_r/\mu_r$, where $\epsilon_r$ is the permittivity of the fluidic dielectric, and $\mu_r$ is the permeability of the fluidic dielectric. A cross-sectional view of such a line is illustrated in FIG. 3*a*.

Figure 3A:
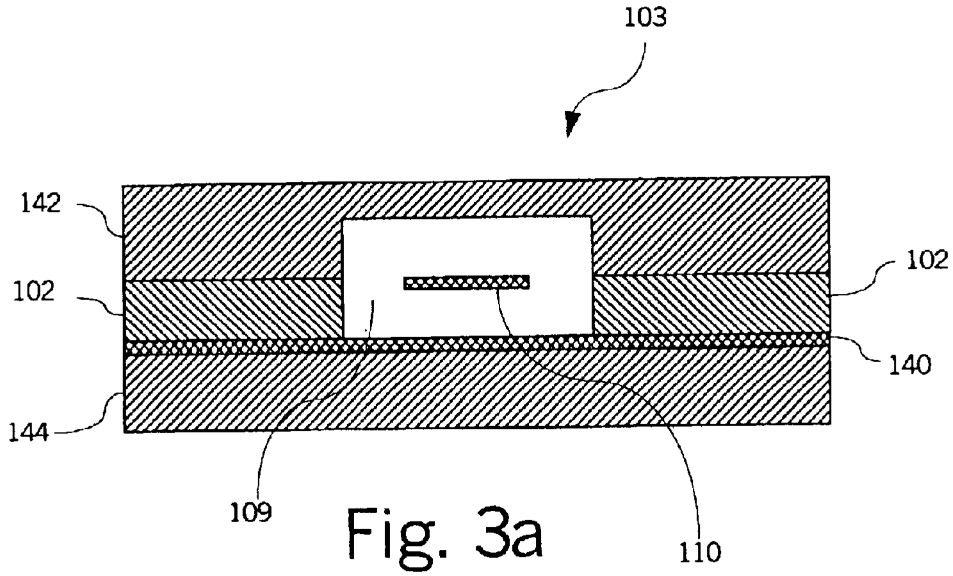
FIG. 3*a* is a cross-sectional view of the quarter-wave transformer in FIG. 1, taken along line 3—3.

FIG. 3*a* is a cross-sectional view of one embodiment of the quarter wave transformer in FIG. 1, taken along line 3—3, that is useful for understanding the invention. As illustrated therein, cavity 109 can be formed in substrate 102 and continued in cap substrates 142 so that the fluidic dielectric is closely coupled to quarter-wave transformer 103 on all sides of quarter-wave element 110. The element 110 is suspended within the cavity 109 as shown. A ground plane 140 is disposed below the element 110 between substrate 102 and base substrate 144.

Figure 3B:
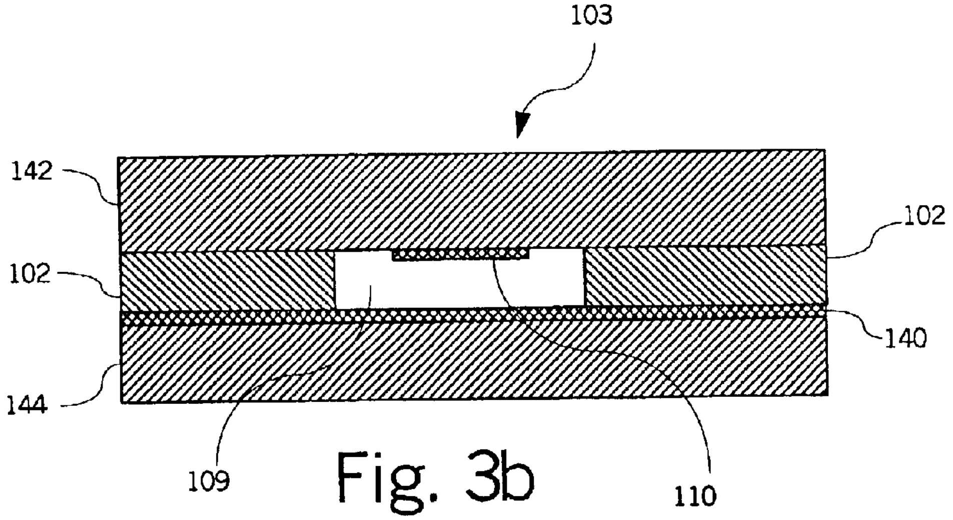
FIG. 3*b* is a cross-sectional view of an alternative embodiment of a quarter-wave transformer structure of FIG. 1.

FIG. 3*b* is a cross-sectional view showing an alternative quarter-wave transformer 103' in which the cavity structure 109' extends on only one side of the element 110' and the element 110' is partially coupled to the solid dielectric substrate 142'.

In the case where the transmission line is also partially coupled to a solid dielectric, then the permeability $\mu_r$ necessary to keep the characteristic impedance of the quarter-wave element can be expressed as follows:

$$\mu_r = \mu_{r,sub}(\epsilon_r/\epsilon_{r,sub})$$

where $\mu_{r,sub}$ is the permeability of the solid dielectric substrate 142, $\epsilon_r$ is the permittivity of the fluidic dielectric 108 and $\epsilon_{r,sub}$ is the permittivity of the solid dielectric substrate 142.

The impedance of a transmission line is not independent of the transmission line structure. However, it is always proportional to the square root of the ratio of the permeability to the permittivity of the media in which the conducting structures are embedded. Thus, for any transmission line, such as the quarter-wave element 110, if both the permeability and permittivity are changed in the same proportion, and no other changes are made, the impedance will remain constant. The equation specified enforces the condition of a constant ratio of $\mu_r$ to $\epsilon_r$ and thus ensure constant impedance for all transmission line structures.

At this point it should be noted that while the embodiment of the invention in FIG. 1 is shown essentially in the form of a buried microstrip construction, the invention herein is not intended to be so limited. Instead, the invention can be implemented using any type of quarter-wave element 110 by replacing at least a portion of a conventional solid dielectric material that is normally coupled to the quarter-wave element 110 with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

According to one aspect of the invention, the solid dielectric substrate 102, 142, 144 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention.

We claim:

1. A continuously variable quarter-wave transformer, comprising:

a fluidic dielectric having a permittivity and a permeability;

a composition processor adapted for dynamically changing a composition of said fluidic dielectric to vary at least one of said permittivity and said permeability;

a quarter-wave element at least partially coupled to said fluidic dielectric; and a controller for controlling said composition processor to selectively vary at least one of said permittivity and said permeability in response to a control signal.

2. The variable quarter-wave transformer according to claim 1 wherein said controller causes said composition processor to selectively vary said permittivity and said permeability concurrently in response to said control signal.

3. The variable quarter-wave transformer according to claim 1 wherein said quarter-wave transformer has a characteristic impedance and said controller causes said composition processor to selectively vary said permeability to maintain said characteristic impedance approximately constant when said permittivity is varied.

4. The variable quarter-wave transformer according to claim 1 wherein said quarter-wave transformer has a characteristic impedance and said controller causes said composition processor to selectively vary said permeability to adjust said characteristic impedance when said permittivity is maintained approximately constant.

5. The variable quarter-wave transformer according to claim 1 wherein said quarter-wave element is also coupled to a solid dielectric substrate material.

6. The variable quarter-wave transformer according to claim 5 wherein said permeability is varied to be approximately equal to $\mu_{r,sub}(\epsilon_r/\epsilon_{r,sub})$ where $\mu_{r,sub}$ is the permeability of the solid dielectric substrate, $\epsilon_r$ is the permittivity of the fluidic dielectric and $\epsilon_{r,sub}$ is the permittivity of the solid dielectric substrate.

7. The variable quarter-wave transformer according to claim 5 wherein said solid dielectric substrate is formed from a ceramic material.

8. The variable quarter-wave transformer according to claim 5 wherein said solid dielectric substrate is formed from a low temperature co-fired ceramic.

9. The variable quarter-wave transformer according to claim 1 wherein a plurality of component parts are dynamically mixed together in said composition processor responsive to said control signal to form said fluidic dielectric.

10. The variable quarter-wave transformer according to claim 9 wherein said component parts are selected from the group consisting of a low permittivity, low permeability component, a high permittivity, low permeability component, and a high permittivity, high permeability component.

11. The variable quarter-wave transformer according to claim 9 wherein said composition processor further comprises at least one proportional valve, at least one mixing pump, and at least one conduit for selectively mixing and communicating a plurality of said components of said fluidic dielectric from respective fluid reservoirs to a cavity coupled to said quarter-wave transformer.

12. The variable quarter-wave transformer according to claim 9 wherein said composition processor further comprises a component part separator adapted for separating said component parts of said fluidic dielectric for subsequent reuse.

13. The variable quarter-wave transformer according to claim 1 wherein said fluidic dielectric is comprised of an industrial solvent.

14. The variable quarter-wave transformer according to claim 13 including a suspension component of magnetic particles contained within said industrial solvent.

15. The variable quarter-wave transformer according to claim 14 wherein said magnetic particles are formed of a material selected from the group consisting of ferrite, metallic salts, and organo-metallic particles.

16. The variable quarter-wave transformer according to claim 14 wherein said component contains between about 50% to 90% magnetic particles by weight.

17. A continuously variable quarter-wave transformer, comprising:

a fluidic dielectric having a permittivity and a permeability;

a composition processor adapted for changing a composition of said fluidic dielectric to dynamically vary said permittivity and said permeability; and a quarter-wave element at least partially coupled to said fluidic dielectric.

18. A method for minimizing RF signal reflections comprising the steps of:

propagating said RF signal along a quarter-wave transformer coupled to a fluidic dielectric; and dynamically changing a composition of said fluidic dielectric to selectively vary at least one of a permittivity and a permeability of said fluidic dielectric in response to a control signal.

19. The method according to claim 18 further comprising the step of selectively varying said permittivity and said permeability concurrently in response to said control signal.

20. The method according to claim 19 further comprising the step of selecting a component of said fluidic dielectric to include an industrial solvent.

21. The method according to claim 18 further comprising the step of selectively varying said permittivity to maintain a characteristic impedance of said quarter-wave transformer approximately constant when said permeability is varied.

22. The method according to claim 18 further comprising the step of selectively varying said permittivity to adjust a characteristic impedance of said quarter-wave transformer when said permeability is maintained approximately constant.

23. The method according to claim 18 further comprising the step of coupling said quarter-wave transformer to a solid dielectric substrate material.

24. The method according to claim 23 further comprising the step of varying said permeability to be approximately equal to $\mu_{r,sub}(\epsilon_r/\epsilon_{r,sub})$ where $\mu_{r,sub}$ is the permeability of the solid dielectric substrate, $\epsilon_r$ is the permittivity of the fluidic dielectric and $\epsilon_{r,sub}$ is the permittivity of the solid dielectric substrate.

25. The method according to claim 23 further comprising the step of forming said solid dielectric substrate from a ceramic material.

26. The method according to claim 23 further comprising the step of forming said solid dielectric substrate from a low temperature co-fired ceramic.

27. The method according to claim 18 further comprising the step of dynamically mixing a plurality of components in response to said control signal to produce said fluidic dielectric.

28. The method according to claim 27 wherein said components are selected from the group consisting of a low permittivity, low permeability component, a high permittivity, low permeability component, and a high permittivity, high permeability component.

29. The method according to claim 27 further comprising the step of communicating said fluidic dielectric to a cavity adjacent to said quarter-wave transformer.

30. The method according to claim 27 further comprising the step of separating said components into said component parts for subsequent reuse in forming said fluidic dielectric.

31. The method according to claim 18 further comprising the step of selectively varying said permeability to maintain a characteristic impedance of said quarter-wave transformer approximately constant when said permittivity is varied.

32. The method according to claim 31 further comprising the step of selecting a component of said fluidic dielectric to include an industrial solvent that has a suspension of magnetic particles contained therein.

33. The method according to claim 32 further comprising the step of selecting a material for said magnetic particles from the group consisting of a ferrite, metallic salts, and organo-metallic particles.

34. The method according to claim 33 further comprising the step of selecting said component to include about 50% to 90% magnetic particles by weight.

35. The method according to claim 18 further comprising the step of selectively varying said permeability to adjust a characteristic impedance of said quarter-wave transformer when said permittivity is maintained approximately constant.

* * * * *